(12) United States Patent
Matyushkin et al.

(10) Patent No.: US 10,083,853 B2
(45) Date of Patent: Sep. 25, 2018

(54) ELECTROSTATIC CHUCK DESIGN FOR COOLING-GAS LIGHT-UP PREVENTION

(71) Applicant: Lam Research Corporation, Fremont, CA (US)

(72) Inventors: Alexander Matyushkin, San Jose, CA (US); Alexei Marakhtanov, Albany, CA (US); John Patrick Holland, San Jose, CA (US); Keith Gaff, Fremont, CA (US); Felix Kozakevich, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 329 days.

(21) Appl. No.: 14/887,166

(22) Filed: Oct. 19, 2015

(65) Prior Publication Data

US 2017/0110356 A1    Apr. 20, 2017

(51) Int. Cl.
*H01L 21/687* (2006.01)
*H01L 21/683* (2006.01)
*H01L 21/67* (2006.01)

(52) U.S. Cl.
CPC .. *H01L 21/68785* (2013.01); *H01L 21/67109* (2013.01); *H01L 21/6833* (2013.01)

(58) Field of Classification Search
CPC ....... H01H 21/68785; H01H 21/67109; H01H 21/6833; H01L 21/68785; H01L 21/67109; H01L 21/6833
See application file for complete search history.

(56) References Cited

U.S. PATENT DOCUMENTS

| 2012/0241091 A1* | 9/2012 | Chen | H01J 37/32091 |
| | | | 156/345.43 |
| 2013/0021717 A1* | 1/2013 | Singh | H01L 21/6831 |
| | | | 361/234 |
| 2015/0206722 A1* | 7/2015 | Yamamoto | C23C 4/10 |
| | | | 156/345.51 |

* cited by examiner

*Primary Examiner* — Scott Bauer

(74) *Attorney, Agent, or Firm* — Martine Penilla Group, LLP

(57) ABSTRACT

An Electrostatic Chuck (ESC) in a chamber of a semiconductor manufacturing apparatus is presented for eliminating cooling-gas light-up. One wafer support includes a baseplate connected to a radiofrequency power source, a dielectric block, gas supply channels for cooling the wafer bottom, and first and second electrodes. The dielectric block is situated above the baseplate and supports the wafer when present. The first electrode is embedded in the top half of the dielectric block, where the top surface of the first electrode is substantially parallel to a top surface of the dielectric block, and the first electrode is connected to a DC power source. Further, the second electrode is embedded in a bottom half of the dielectric block, the second electrode being electrically connected to the first electrode, where the bottom surface of the second electrode is substantially parallel to a top surface of the baseplate.

18 Claims, 10 Drawing Sheets

ELECTROSTATIC CHUCK DESIGN FOR COOLING-GAS LIGHT-UP PREVENTION

BACKGROUND

1. Field of the Invention

The present embodiments relate to systems, methods, and programs for improving the design of an Electrostatic Chuck (ESC), and more particularly, for eliminating cooling-gas light-up within the ESC.

2. Description of the Related Art

Some new semiconductor manufacturing processes utilize very high radio frequency (RF) power to generate plasma. The high RF power increases the RF currents and total voltages applied to the Electrostatic Chuck (ESC), also referred to herein as chuck or wafer susceptor, when compared to previous solutions with lower RF power levels.

In addition, some new plasma etch processes require significantly lower RF frequencies (e.g., 2 MHz or lower) than previously utilized. The lower RF frequencies cause an increase in the RF voltage applied across the ESC ceramic. The high voltage applied across the ceramic may cause electrical discharge (i.e., arcing) between the wafer and the baseplate, and may cause ignition of the heat transfer gas (e.g., He) in the gas supplying holes. This phenomenon is also commonly referred to as gas light-up.

Arcing in the ESC may cause damage to the ESC and/or damage to other chamber components. Further, such arcing may in some cases cause interruption of the manufacturing process. Sometimes the destruction of the ESC is fast, catastrophic, and easily detected, but other times there is a gradual deterioration that may unknowingly affect multiple wafers, and the damage to the wafers may only be detectable at later steps of the manufacturing process.

It is in this context that embodiments arise.

SUMMARY

An Electrostatic Chuck (ESC) in a chamber of a semiconductor manufacturing apparatus is presented for eliminating cooling-gas light-up. One wafer support includes a baseplate connected to a radiofrequency power source, a dielectric block, gas supply channels for cooling the wafer bottom, and first and second electrodes. The dielectric block is situated above the baseplate and supports the wafer during operation of the chamber. The first electrode is embedded in the top half of the dielectric block, where the top surface of the first electrode is substantially parallel to a top surface of the dielectric block, and the first electrode is connected to a Direct Current (DC) power source. Further, the second electrode is embedded in a bottom half of the dielectric block, the second electrode being electrically connected to the first electrode, where the bottom surface of the second electrode is substantially parallel to a top surface of the baseplate.

It should be appreciated that the present embodiments can be implemented in numerous ways, such as a method, an apparatus, a system, a device, or a computer program on a computer readable medium. Several embodiments are described below.

One general aspect includes a wafer support structure in a chamber of a semiconductor manufacturing apparatus, the wafer support structure including a baseplate connected to a radio frequency (RF) power source, a dielectric block, a plurality of gas supply channels, a first electrode, and a second electrode. The dielectric block is situated above the baseplate, the dielectric block having a bottom surface interfaced with the baseplate and a top surface for supporting a wafer when present. The plurality of gas supply channels are disposed in the baseplate and extending from the baseplate and through the dielectric block to a location proximate to the top surface of the dielectric block. The first electrode is embedded in a top half of the dielectric block, the first electrode being proximate and below the top surface of the dielectric block, where a top surface of the first electrode is substantially parallel to the top surface of the dielectric block, where the first electrode is connected to a direct current (DC) power source. The second electrode is embedded in a bottom half of the dielectric block, the second electrode being proximate and above a top surface of the baseplate such that a separation distance in the dielectric block is defined between the first electrode and the second electrode, the second electrode being electrically connected to the first electrode, where a bottom surface of the second electrode is substantially parallel to a top surface of the baseplate.

Implementations may include one or more of the following features. The wafer support structure as recited where the dielectric block includes a ceramic puck and a bonding layer, the bonding layer bonding the ceramic puck to the baseplate. The wafer support structure as recited where the second electrode is connected to the first electrode through one or more vertical vias embedded in the dielectric block, the one or more vertical vias disposed below the first electrode and proximate to a periphery of the first electrode. The wafer support structure as recited where a first capacitance is formed between the top surface of the dielectric block and the top surface of the first electrode and a second capacitance is formed between the top surface of the second electrode and a top surface of the baseplate. The wafer support structure as recited where an impedance to the RF power through the dielectric block is associated with the first capacitance and the second capacitance. The wafer support structure as recited where a distance between the top surface of the dielectric block and the top surface of the first electrode is in a range of 0.2 mm to 0.5 mm, where a distance from the second electrode to the baseplate is in a range from 1 mm to 3 mm. In one embodiment, the distance from the first electrode to the second electrode is greater than the distance from the top surface of the dielectric block to the first electrode, and the distance from the first electrode to the second electrode is greater than a distance from the second electrode to the baseplate. The wafer support structure as recited where the baseplate is conductive, where the dielectric block is nonconductive. The wafer support structure as recited where the baseplate is not connected to the dc power source. The wafer support structure as recited where the second electrode is embedded on the top half of the dielectric block. The wafer support structure as recited where the second electrode is connected to the baseplate through one or more vertical vias embedded in the dielectric block, the one or more vertical vias disposed below the first electrode and proximate to a periphery of the first electrode. The wafer support structure as recited where the second electrode is connected to the baseplate through a conductive cylindrical structure embedded in the dielectric block, the conductive cylindrical structure surrounding the plurality of gas supply channels. The wafer support structure as recited where a capacitance is formed between the top surface of the dielectric block and the top surface of the second electrode. The wafer support structure as recited where an impedance to the RF power through the dielectric block is associated with the capacitance. The wafer support structure as recited where a distance between the top surface of the dielectric block and the top surface of the first electrode is in a range of 0.2 mm to 0.5 mm, where a distance from the first electrode to the second electrode is in a range from 0.3 mm to 3 mm. The wafer support structure as recited where the baseplate is not connected to the dc power source. Implementations of the described techniques may include hardware, a method or process, or computer software on a computer-accessible medium.

One general aspect includes a wafer support structure in a chamber of a semiconductor manufacturing apparatus, the wafer support structure including a baseplate connected to a radio frequency (RF) power source. The wafer support structure also includes a dielectric block, situated above the baseplate, the dielectric block having a bottom surface interfaced with the baseplate and a top surface for supporting a wafer when present, the dielectric block including a ceramic puck and a bonding layer which is below the ceramic puck and above the baseplate. The wafer support structure also includes a plurality of gas supply channels disposed in the baseplate and extending from the baseplate and through the dielectric block to a location proximate to the top surface of the dielectric block. The wafer support structure also includes a first electrode embedded in a top half of the dielectric block, the first electrode being proximate and below the top surface of the dielectric block, where a top surface of the first electrode is substantially parallel to the top surface of the dielectric block, where the first electrode is connected through a vertical connector to a direct current (DC) power source below the baseplate. The wafer support structure also includes a second electrode embedded in a bottom half of the dielectric block, the second electrode being proximate and above a top surface of the baseplate such that a separation distance in the dielectric block is defined between the first electrode and the second electrode, the second electrode being electrically connected to the first electrode through a plurality of vertical conductive vias, where a bottom surface of the second electrode is substantially parallel to a top surface of the baseplate.

One general aspect includes a wafer support structure in a chamber of a semiconductor manufacturing apparatus, the wafer support structure including: a baseplate connected to a radio frequency (RF) power source. The wafer support structure also includes a dielectric block, situated above the baseplate, the dielectric block having a bottom surface interfaced with the baseplate and a top surface for supporting a wafer when present. The wafer support structure also includes a plurality of gas supply channels disposed in the baseplate and extending from the baseplate and through the dielectric block to a location proximate to the top surface of the dielectric block. The wafer support structure also includes a first electrode embedded in a top half of the dielectric block, the first electrode being proximate and below the top surface of the dielectric block, where a top surface of the first electrode is substantially parallel to the top surface of the dielectric block, where the first electrode is connected to a direct current (DC) power source. The wafer support structure also includes a second electrode embedded in the dielectric block proximate and below the first electrode such that a separation distance in the dielectric block is defined between the second electrode and the baseplate, the second electrode being electrically connected to the baseplate that is connected to the rf power source, where a bottom surface of the second electrode is substantially parallel to a top surface of the baseplate. Other embodiments of this aspect include corresponding computer systems, apparatus, and computer programs recorded on one or more computer storage devices, each configured to perform the actions of the methods.

Implementations may include one or more of the following features. The wafer support structure as recited where the second electrode is embedded on the top half of the dielectric block. The wafer support structure as recited where the second (RF) electrode is connected to the baseplate through one or more vertical vias embedded in the dielectric block, the one or more vertical vias disposed below the first (DC) electrode and proximate to a periphery of the first (DC) electrode. The wafer support structure as recited where the second (RF) electrode is connected to the baseplate through a conductive cylindrical structure embedded in the dielectric block. The wafer support structure as recited where a capacitance is formed between the top surface of the dielectric block and the top surface of the second (RF) electrode. The wafer support structure as recited where an impedance to the RF power through the dielectric block is associated with the capacitance. The wafer support structure as recited where a distance between the top surface of the dielectric block and the top surface of the first electrode is in a range of 0.2 mm to 0.5 mm, where a distance from the first electrode to the second electrode is in a range from 0.3 mm to 3 mm. The wafer support structure as recited where the baseplate is not connected to the dc power source. Implementations of the described techniques may include hardware, a method or process, or computer software on a computer-accessible medium.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

The following embodiments describe systems, methods, and devices for eliminating cooling-gas light-up within an Electrostatic Chuck (ESC). Embodiments presented described solutions for eliminating arcing in the ESC, and for solving the potential problem of coolant gas (e.g., He)

light-up, by modifying the RF power delivery path and reducing the RF impedance in the ESC and the RF voltage across the ESC.

This application is related to U.S. Patent Application No. 62/197,253, filed Jul. 27, 2015, entitled "Electrostatic Chuck Including Embedded Faraday Cage for RF Delivery and Associated Methods for Operation, Monitoring, and Control", which is incorporated herein by reference. This application describes the implementation of an ESC with a Faraday cage.

The ESC includes features to reduce the RF voltage applied across the ESC ceramic between the baseplate and the wafer. By lowering RF voltage across the ceramic, ESC arcing and light-up are prevented from occurring. Hence, chamber uptime and yield are improved, while manufacturer's warranty and replacement costs are decreased.

Embodiments presented for ESC's with thick ceramic pucks (e.g., 5 mm or more, but other values are also possible) decrease the ESC impedance by moving an RF-connected element (e.g., RF electrode) close to the wafer being processed. As the ESC impedance decreases, so decreases the voltage drop across the ceramic puck holding the wafer. As the voltage becomes lower, the probability of the ESC arcing or light-up is substantially reduced.

Another embodiment provides for a thinner ESC ceramic puck (e.g., 1 mm) attached to RF-powered baseplate. In this case, the gap between the RF electrode and the wafer is small, resulting in low impedance and low voltage drop. Therefore, probability of Helium light-up and arcing is low.

It will be apparent, that the present embodiments may be practiced without some or all of these specific details. In other instances, well-known process operations have not been described in detail in order not to unnecessarily obscure the present embodiments.

Figure 1A:
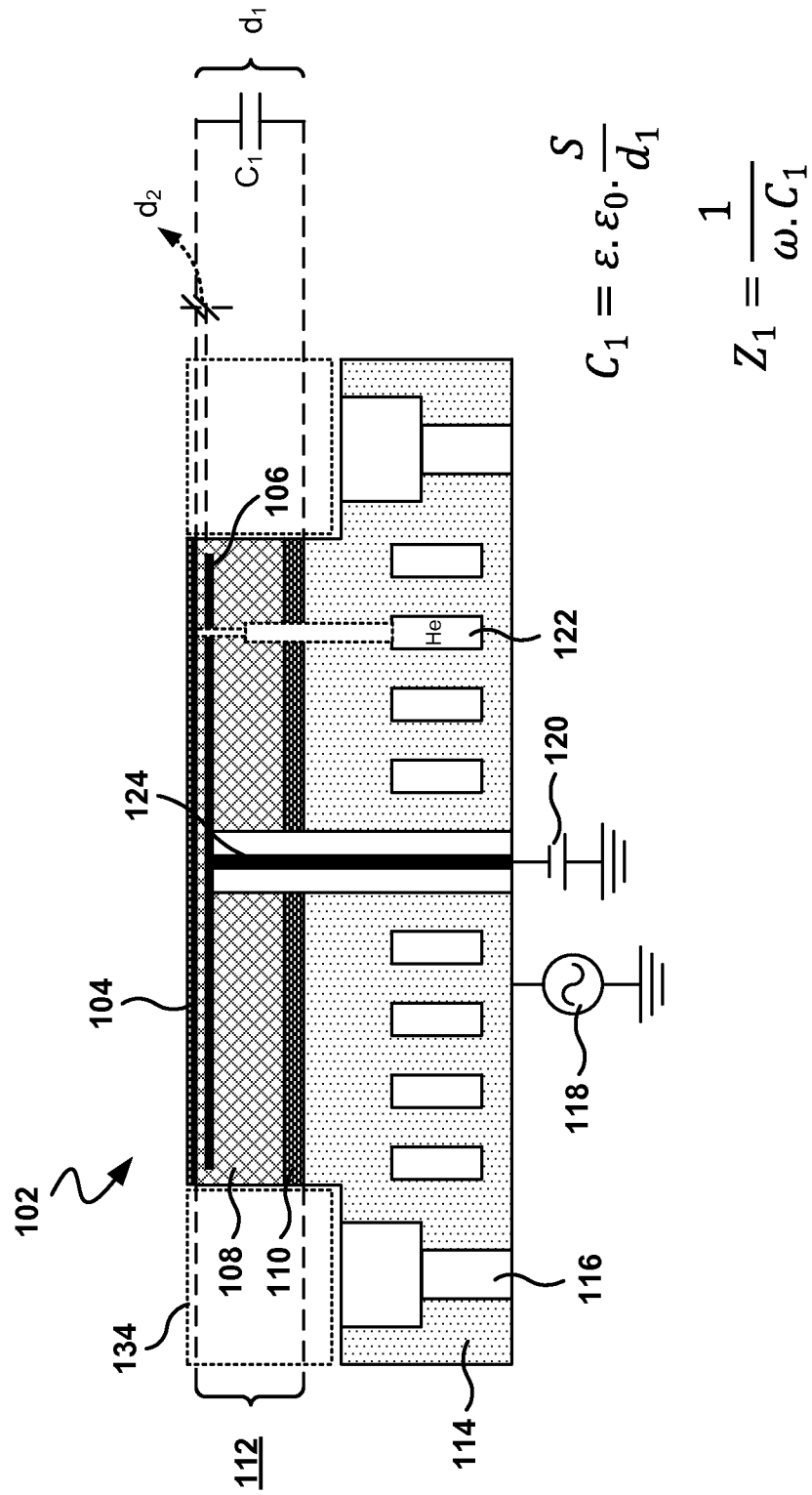
FIG. 1A illustrates an Electrostatic Chuck (ESC) for supporting a wafer within a chamber of a semiconductor manufacturing apparatus, according to one embodiment.

FIG. 1A illustrates an Electrostatic Chuck (ESC) 102 for supporting a wafer 104 within a chamber of a semiconductor manufacturing apparatus, according to one embodiment. The ESC includes baseplate 114, which is formed of a conductive material such as aluminum, although other conductive materials are also possible. The ESC further includes a dielectric block 112 on top of the baseplate 114. In one embodiment, the dielectric block 112 includes ceramic puck 108 on top of a bonding layer 110 used to bond together ceramic puck 108 and baseplate 114.

DC electrode 106 is embedded within the ceramic puck 108, below and near the top surface of the dielectric block 112. The height of dielectric block 112 is referred to herein as $d_1$, and the top surface of DC electrode 106 is at distance $d_2$ below the top surface of dielectric block 112. In one embodiment, the height of ceramic puck 108 is 5 mm, and in other embodiments the height of ceramic puck 108 is in a range from 2 mm to 10 mm, but other values are also possible. Further, in one embodiment, bonding layer 110 has a height in the range of 0.1 mm to 1 mm, but other values are also possible. In one embodiment, the distance $d_2$ is in the range of 0.1 mm-2 mm, but other values are also possible.

In one embodiment, an edge ring 134 is placed around ESC 102 in a step region defined above baseplate 114 and outside dielectric block 112. Edge ring 134 may be a single ring or may be a ring assembly with a plurality of rings that combined form the edge ring. During operation of the chamber, the top surface of edge ring 134 is coplanar with the top surface of wafer 104 to present a uniform surface to the plasma, resulting in uniform processing across the surface of wafer 104.

In one exemplary embodiment, the height of the bonding layer 110 is 0.58 mm (0.25 mm for the bond and 0.33 mm for the spray), the height of the ceramic puck 108 is 5 mm (resulting in a distance $d_1$ of 5.58 mm), and distance $d_2$ is 0.3 mm.

In one embodiment, DC electrode 106 is embedded within the top half of dielectric block 112, but other embodiments include the DC electrode 106 closer or farther from the top surface of the ESC, such as in the top third of dielectric block 112, or in the top fourth of dielectric block 112, or in the top tenth of dielectric block 112. Other embodiments may include a DC electrode within the bottom half of dielectric block 112.

DC electrode 106 is connected to DC power source 120, which is situated below baseplate 114, via vertical connector 124. Baseplate 114 is connected to RF power source 118, and a C-bore hole 116 is provided for holding screws.

During operation of the chamber, plasma is generated on top of the wafer 104, and the exposure to the plasma heats the wafer. To keep wafer 104 from becoming too hot, helium gas is supplied to the bottom surface of the wafer to cool the wafer from underneath. A plurality of helium gas distribution channels 122 supply the gas that cools the wafer from underneath, bringing the gas to the bottom of the wafer directly. In other embodiments, there could be other coolants that also remove heat from the wafer. There are a plurality of holes on the top surface of the ESC that provide the helium, such as 20 or 40 holes, and a small holes in the ceramic (i.e., dielectric block 112) deliver the gas to the underneath of the wafer. For example, the holes in the ceramic can be from 0.3 mm to 0.5 mm, although other values are also possible.

In one embodiment, when RF is applied to baseplate 114, a capacitance $C_1$ is created between the top surface of ESC 102 and the top surface of baseplate 114. This capacitance $C_1$ creates an impedance $Z_1$, which is inversely proportional to the capacitance, so the smaller the capacitance, the higher the impedance.

Further, the bigger the distance $d_1$ becomes, the lower the capacitance $C_1$ becomes. The voltage drop in the helium channel is directly proportional to the impedance, therefore, the greater $d_1$ becomes, the greater the impedance and the greater the voltage drop becomes.

In one embodiment, the capacitance is calculated as $$C_1 = \varepsilon \cdot \varepsilon_0 \cdot \frac{S}{d_1},$$

where $\varepsilon$ is the dielectric constant for the material, $\varepsilon_0$ is the dielectric constant for the vacuum, S is the surface area, and $d_1$ is the distance between the surfaces that form the capacitor.

The impedance for the RF current is calculated as $$Z_1 = \frac{1}{\omega \cdot C_1},$$

where $\omega$ is the frequency of the RF power supply. In one embodiment, the RF has a frequency of 400 kHz, and in another embodiments, the frequency is in a range from 100 kHz to 300 MHz.

It is noted that the voltage drop across the dielectric is also a function of the gas pressure, but the gas pressure must be preserved in order to keep the wafer temperature under control. Therefore, the range for decreasing the gas pressure is usually limited, and decreasing gas pressure may not be enough to safely reduce light-up in the gas supply channels. On the other hand, embodiments presented herein change the distance associated with the impedance in order to reduce the voltage drop across the gas supply.

Figure 1B:
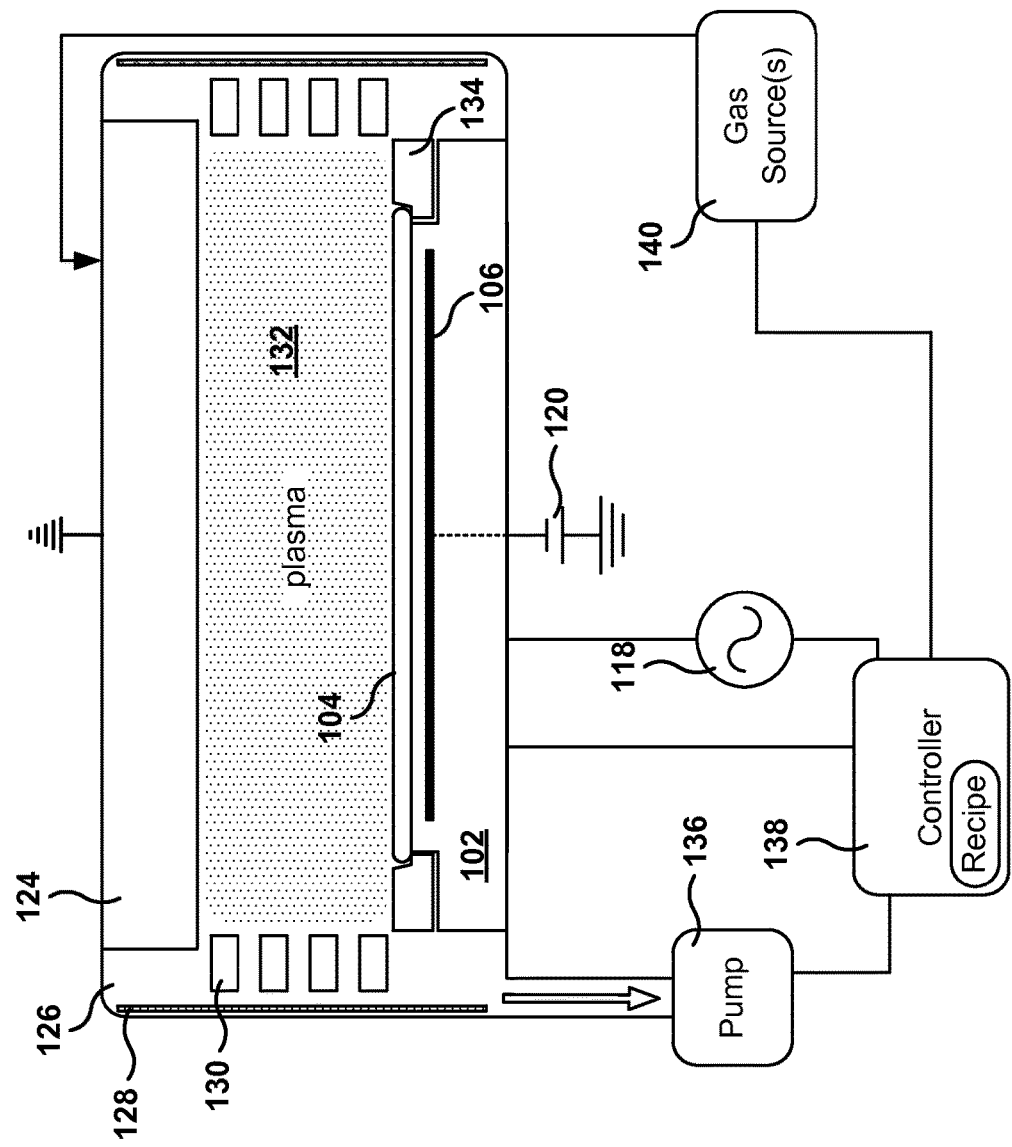
FIG. 1B is a capacitive coupled plasma processing system, according to one embodiment.

FIG. 1B is a capacitive coupled plasma processing system, according to one embodiment. The capacitive coupled plasma processing system includes a plasma process chamber 126, controller 138, radio frequency (RF) power source 118, pump 136 and one or more gas sources 140 for the plasma process chamber 126. In some embodiments, the plasma process chamber 126 may have one or more RF sources coupled to the top electrode. The plasma process chamber 126 includes an electrostatic chuck 102 for supporting a wafer 104 to be processed, and an edge ring 134. In some embodiments, the plasma process chamber 126 may also include confinement rings 130 for confining the plasma in the chamber, and a chamber wall liner 128.

RF power source 118 can include multiple RF sources or a single RF source capable of producing multiple frequencies of the RF signals from about 100 kHz to about 300 MHz. By way of example, some RF signals have frequencies of about 27 MHz to about 60 MHz, and/or 200 kHz to 1 MHz. The RF signals can have an RF power between about 50 W and about 30 kW. By way of example, between about 100 W and about 15,000 W. RF power source 118 can produce pulsed or non-pulsed RF signals.

The controller 138 includes a processor, memory, software logic, hardware logic and input and output subsystems from communicating with, monitoring and controlling the capacitive coupled plasma processing system. The controller 138 also includes one or more recipes including multiple set points various operating parameters (e.g., voltage, current, frequency, pressure, flow rate, power, temperature, etc.) for operating the capacitive coupled plasma processing system.

The plasma process chamber 126 also includes an upper electrode 124. In operation, the upper electrode 124 is typically grounded but could be biased or coupled to a second RF source (not shown). The RF power source 118 provides an RF signal to the electrostatic chuck 102 and the gas sources 140 inject the desired process gas(es) into the chamber 126. A plasma 132 is then formed between the upper electrode 124 and the electrostatic chuck 102. The plasma 132 can be used to etch the surface of the wafer 104 or volatilize deposits formed on various inner surfaces of the plasma process chamber 126.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 2A:
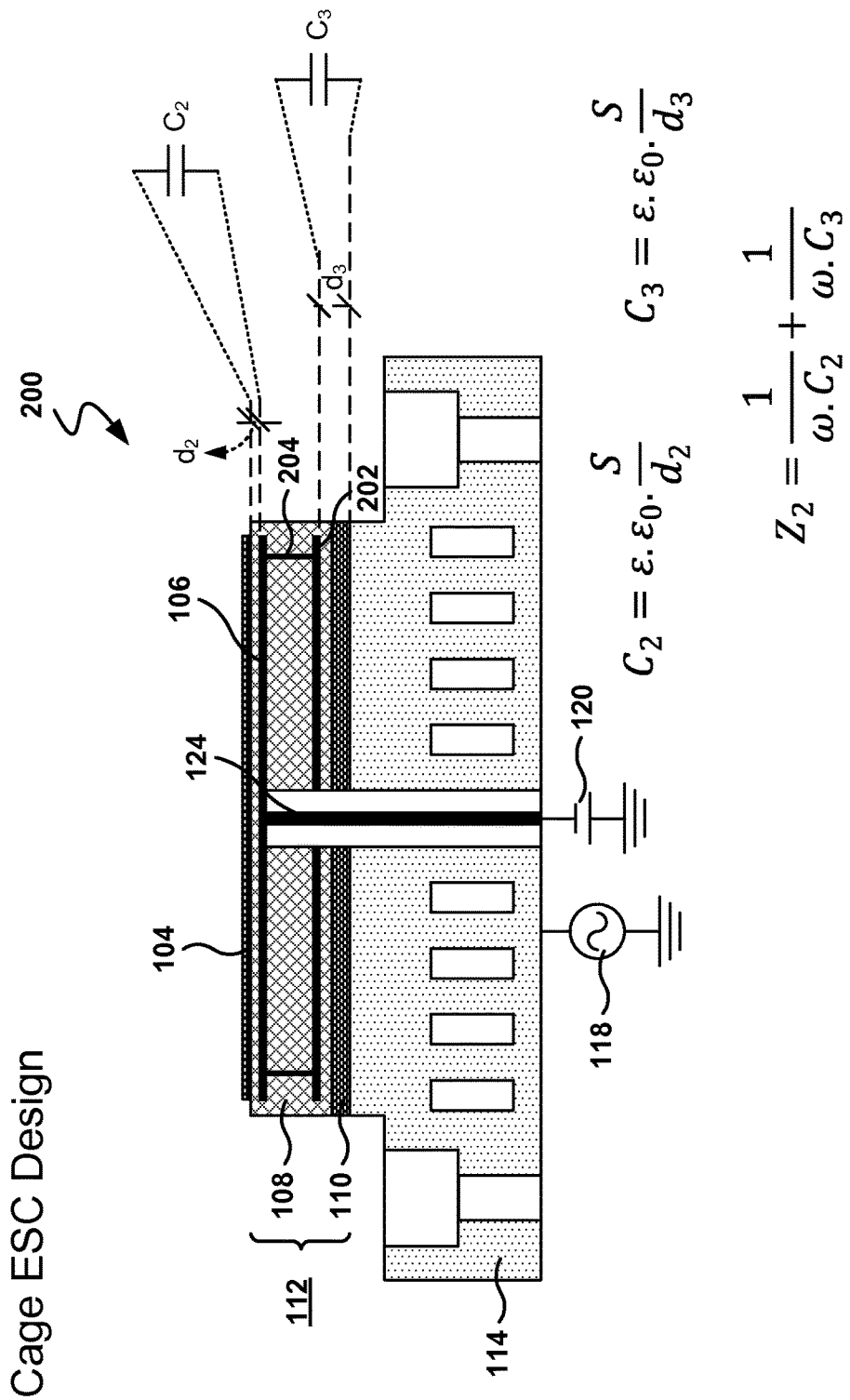
FIGS. 2A-2C illustrates an ESC with a Faraday cage design, according to several embodiments.
Figure 2B:
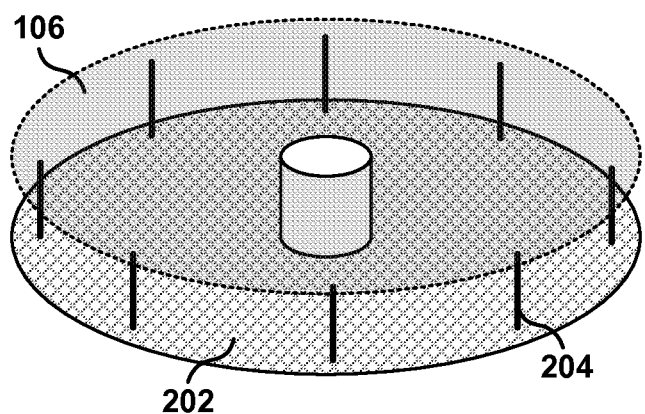
Figure 2C:
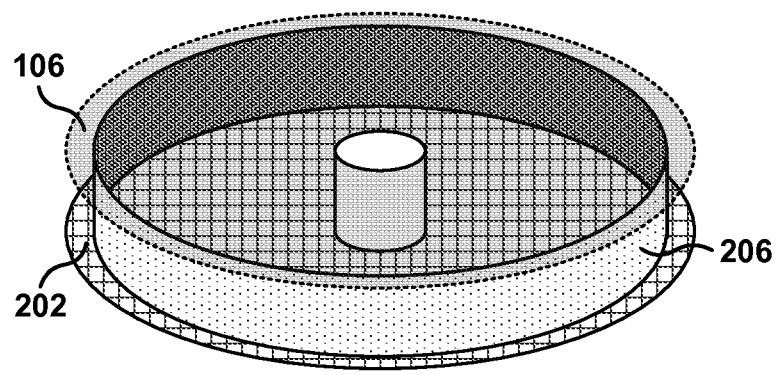

FIGS. 2A-2C illustrates an ESC 200 with a Faraday cage design, according to several embodiments. FIG. 2A illustrates a side view of the ESC 200 with the Faraday cage design, according to one embodiment. The ESC of FIG. 2A includes the same baseplate 114 and DC electrode 106 as in FIG. 1A, but the ESC also includes a second electrode 202 embedded in the dielectric block 112. The second electrode 202 is above bond layer 110, and the second electrode 202 is electrically connected to the first electrode through one or more via connectors 204.

Therefore, as the RF current flows through dielectric block 112, the RF current travels through a capacitor $C_3$ formed between baseplate 114 and the second electrode 202, then the RF current flows through via connector 204 which is connected to the DC electrode 106, and then the RF current flows through a capacitor $C_2$ formed between DC electrode 106 and the top surface of the dielectric block 112.

The combination of the first and second electrode as shown is also referred to as a floating electrode, and makes the ceramic puck 108 appear thinner to the flow of RF current through the ESC. Further, DC electrode 106, the second electrode 202, and the via connector 204 form a Faraday cage so the RF current flows around the Faraday cage while traveling through the ceramic puck 108. The separation distance between DC electrode 106 and second electrode 202 allows for the formation of the Faraday cage in the dielectric block 112. The resulting effect is a decrease in the impedance to the RF current through ceramic puck 108, and a lower voltage drop over dielectric block 112. In a sense, the RF current sees the metal structure within the ceramic puck 108 as a solid piece of metal.

The distance $d_2$ between the top surface of the ceramic puck 108 and the top surface of DC electrode 106 causes capacitor $C_2$ to be in the RF current path, where $C_2$ is calculated as $$C_2 = \varepsilon \cdot \varepsilon_0 \cdot \frac{S}{d_2}.$$

A distance $d_3$ between the bottom surface of second electrode 202 and the top surface of baseplate 114 causes another capacitor $C_3$ to be in the RF current path, where $C_3$ is calculated as $$C_3 = \varepsilon \cdot \varepsilon_0 \cdot \frac{S}{d_3}.$$

The resulting impedance $Z_2$ through dielectric block 112 can be calculated based on the values of $C_2$ and $C_3$ as $$Z_2 = \frac{1}{\omega \cdot C_2} + \frac{1}{\omega \cdot C_3}.$$

By bringing RF closer to the wafer, the problem of high RF voltage between wafer 104 and baseplate 114 is eliminated or reduced substantially. Other solutions aim at preventing ESC light-up by decreasing all gaps using ceramic sleeves or porous plugs, but these solutions try to eliminate the consequences of the high voltage across the dielectric instead of eliminating the problem. Embodiments presented herein eliminate the problem of the high voltage across the dielectric by reducing the impedance for the RF power, thereby decreasing the voltage drop across the dielectric.

In one embodiment, distance $d_2$ between the top surface of the dielectric block and the top surface of the DC electrode is in a range of 0.2 mm to 0.5 mm, and the distance $d_3$ from the second electrode to the baseplate is in a range from 1 mm to 3 mm. Further yet, in one embodiment, the thickness of the dielectric block 112 is in the range from 3 mm to 20 mm. In one embodiment, the thickness of dielectric block 112 is 5 mm-5.5 mm. In one embodiment, bonding layer 110 has a height in the range of 0.1 mm to 1 mm, but other values are also possible.

In one embodiment, the distance from the first electrode to the second electrode is greater than the distance from the top surface of the dielectric block to the first electrode, and the distance from the first electrode to the second electrode is greater than a distance from the second electrode to the baseplate. In one embodiment, the baseplate is conductive and the dielectric block is nonconductive, and baseplate 114 is not connected to DC power source 120.

FIG. 2B illustrates the metal structure embedded within the ceramic puck 108. In one embodiment, DC electrode 106 and the second electrode 202 are connected by a plurality of via connectors 204. In one embodiment, there are 8 via connectors 204 defined near the periphery of DC electrode 106, but in other embodiments a different number of via connectors can be utilized, such as 1, 2, 4, 16, 32, or any other number.

FIG. 2C illustrates a connection between the DC electrode 106 and the second electrode 202 via a cylindrical conductive structure 206. In one embodiment, the cylindrical conductive structure 206 may be placed near the periphery of DC electrode 106, but other embodiments may include a cylindrical conductive structure 206 with a smaller radius, as long as the DC electrode and second DC electrode are interconnected.

In one embodiment, a wafer support includes a baseplate connected to a radiofrequency power source, a dielectric block, gas supply channels for cooling the wafer bottom, and first and second electrodes. The dielectric block is situated above the baseplate and supports the wafer during operation of the chamber. The first electrode is embedded in the top half of the dielectric block, where the top surface of the first electrode is substantially parallel to a top surface of the dielectric block, and the first electrode is connected to a DC power source. Further, the second electrode is embedded in a bottom half of the dielectric block, the second electrode being electrically connected to the first electrode, where the top surface of the second electrode is substantially parallel to a top surface of the baseplate.

Figure 3:
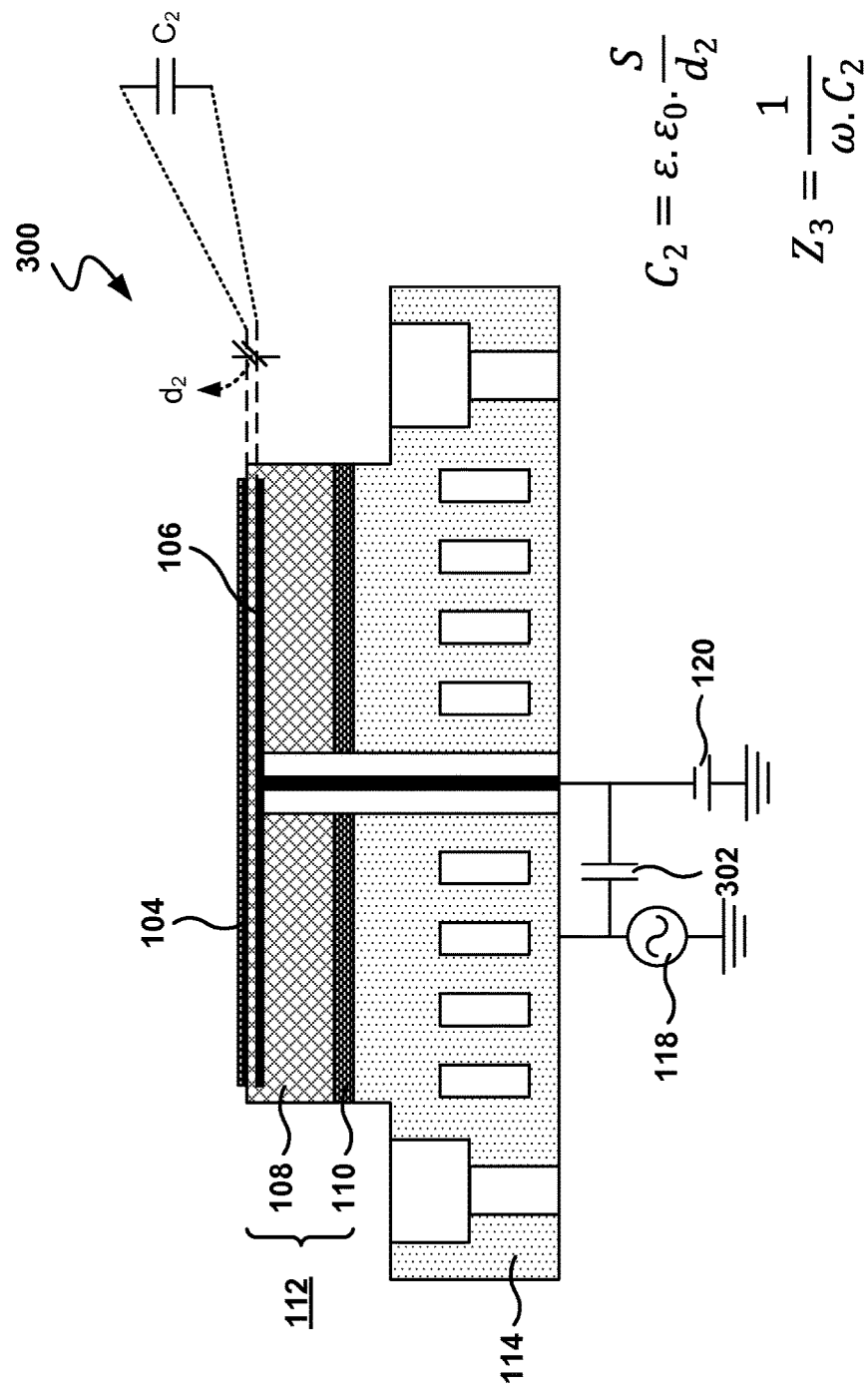
FIG. 3 illustrates an ESC with a radio frequency path to the DC electrode, according to one embodiment.

FIG. 3 illustrates an ESC 300 with a radio frequency path to the DC electrode, according to one embodiment. The ESC 300 of FIG. 3 includes the same baseplate 114 and DC electrode 106 as in FIG. 1A, but there is an additional connection from the RF power source 118 to DC electrode 106 through capacitive divider 302, which is used to let through the desired RF power at the desired frequency, and filter other RF power sources, if any.

In one embodiment, RF power source 118 includes two frequencies, 400 KHz, and 60 MHz, where capacitive divider 302 filters the 60 MHz frequency out so only the 400 KH frequency reaches the DC electrode 106.

As a result, the RF power is close to the top surface of the ESC 300, and the only impedance between the RF power source 118 and the plasma in the chamber is because of capacitance $C_2$ formed between the top surface of the dielectric block 112 and the top surface of DC electrode 106, which are at the distance $d_2$.

The distance $d_2$ that the RF current has to flow through the dielectric is now much smaller, which results in a lower impedance and a lower voltage drop. By bringing RF closer to the wafer, the problem of high RF voltage between wafer 104 and baseplate 114 is eliminated or reduced substantially.

The capacitance $C_2$ is calculated as $$C_2 = \varepsilon \cdot \varepsilon_0 \cdot \frac{S}{d_2},$$

and the resulting impedance $Z_3$ is calculated according to the equation $$Z_3 = \frac{1}{\omega \cdot C_2}.$$

In one embodiment, the distance $d_2$ between the top surface of the dielectric block and the top surface of the DC electrode is in a range of 0.2 mm to 0.5 mm, and the thickness of the dielectric block 112 is in the range from 1 mm to 20 mm. In one embodiment, the thickness of the dielectric block 112 is 5 mm. In one embodiment, bonding layer 110 has a height in the range of 0.1 mm to 1 mm, but other values are also possible.

In one embodiment, DC electrode 106 is embedded within the top half of the ceramic puck 108, and in another embodiment, DC electrode 106 is embedded within the top fourth of the ceramic puck 108, although other embodiments may place the DC electrode at a different distance from the top surface of the ESC 300.

Figure 4A:
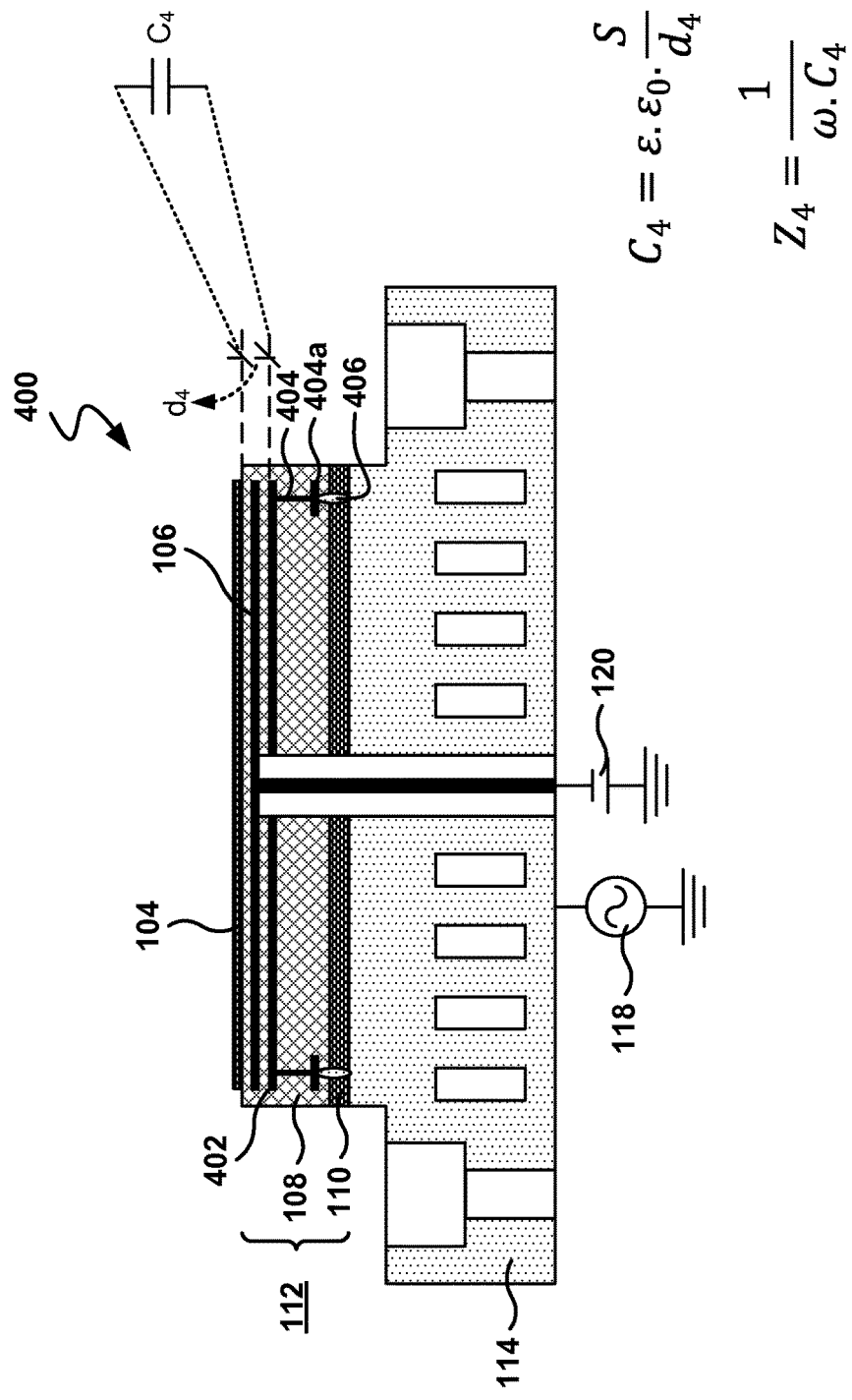
FIGS. 4A-4D illustrate an ESC 400 with an RF electrode below the DC electrode and embedded within the dielectric block that supports the wafer, according to several embodiments.

FIGS. 4A-4D illustrate an ESC 400 with an RF electrode below the DC electrode and embedded within the dielectric block that supports the wafer, according to several embodiments. FIG. 4A illustrates the side view of ESC 400.

ESC 400 includes the same baseplate 114 and DC electrode 106 as in FIG. 1A, but the ESC also includes an RF electrode 402 embedded in the dielectric block 112. The RF electrode 402 is above bonding layer 110 and below DC electrode 106. RF electrode 402 is electrically connected to baseplate 114 (which is connected to RF power source 118) through via connector 404 and RF gasket 406 (or some other electricity conductive media). A contact surface 404a at the bottom of via connector 404 is provided for establishing contact between via connector 404 and RF gasket 406. Via connector 404 is coupled at the top to the RF electrode 402 and at the bottom to RF gasket 406, which establishes the electrical contact to baseplate 114 through bonding layer 110.

Other embodiments may have other type of connections from the RF electrode 402 to the baseplate, and some examples are illustrated below with reference to FIGS. 4B-4D, as long as an electrical connection is implemented between the RF electrode and baseplate 114.

In this case, instead of trying to bring the baseplate up closer to the wafer, the RF is brought upwards to be near DC electrode 106. In ESC 400, the RF current flows through baseplate 114 and via connector 404 to RF electrode 402, and from RF electrode 402 to the chamber through capacitance C4 formed between the RF electrode 402 and the top surface of the ESC 400.

The distance $d_4$ between RF electrode 402 and the top of the ceramic puck 108 determines capacitance $C_4$. Since the distance $d_4$ is smaller than the height of dielectric block 112, the capacitance is increased and the impedance reduced, which results in a reduction of the voltage drop over the dielectric.

The capacitance $C_4$ is calculated based on distance $d_4$ as $$C_4 = \varepsilon \cdot \varepsilon_0 \cdot \frac{S}{d_4},$$

and the resulting impedance $Z4$ is calculated as $$Z_4 = \frac{1}{\omega \cdot C_4}.$$

In one embodiment, the distance $d_4$ between the top surface of the dielectric block and the top surface of the RF electrode 402 is in a range of 0.3 mm to 1 mm, but other values are also possible. Further yet, in one embodiment, the thickness of the dielectric block 112 is in the range from 3 mm to 20 mm. In one embodiment, the thickness of the dielectric block 112 is 5.5 mm. In one embodiment, bonding layer 110 has a height in the range of 0.1 mm to 1 mm, but other values are also possible. In one embodiment, the distance from the top of the ESC to the top of the DC electrode is in the range of 0.1 mm-2 mm, but other values are also possible.

In one embodiment, both DC electrode 106 and RF electrode 402 are embedded within the top half of the ceramic puck 108, but other embodiments may dispose the electrodes at different heights within the ceramic puck. In another embodiment, the RF electrode 402 is placed above DC electrode 106.

Figure 4B:
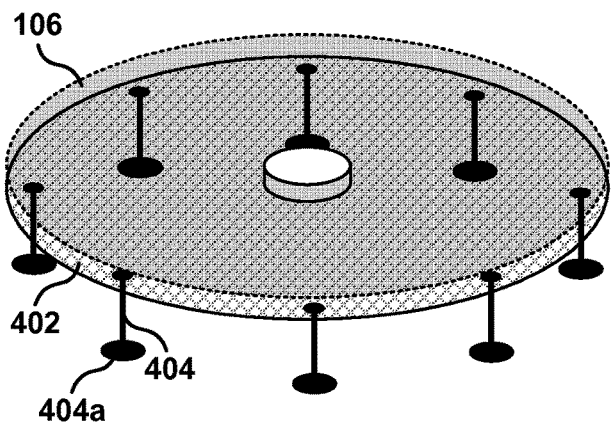

FIG. 4B illustrates the connection from the RF electrode to the baseplate via a plurality (e.g., 8) of metallic via connectors 404, and at the bottom of each via connector 404, contact surface 404a is provided to attach to RF gasket 406. Other embodiments may have a different number of via conductors, such as 1, 2, 4, etc., as long as enough via conductors are provided for the RF current to flow from the baseplate to RF electrode 402.

Figure 4C:
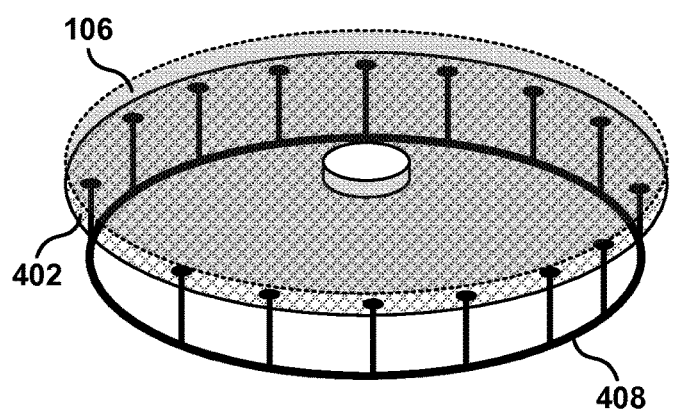

In the embodiment of FIG. 4C, a plurality of via conductors (e.g., 16) are connected to a conductive circle 408 at the bottom that interconnects the bases of all the via conductors. Conductive circle 408 can then be electrically connected to the baseplate, such as by one or more RF gasket 406.

Figure 4D:
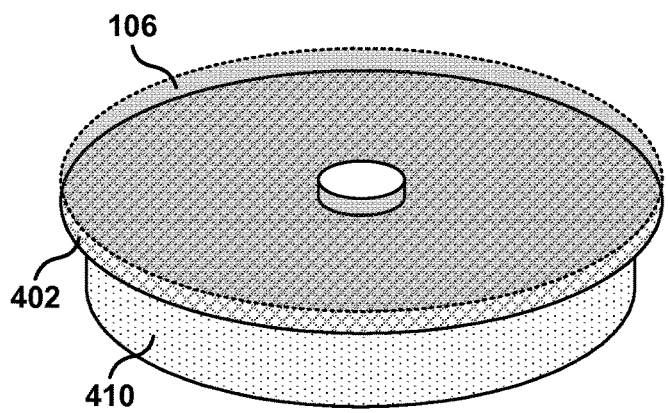

In the embodiment of FIG. 4D, a conductive cylinder 410, embedded in the ceramic puck, is utilized to interconnect the RF electrode to the baseplate. In one embodiment, conductive cylinder 410 is embedded only in the ceramic puck without going through the bonding layer 110, but in another embodiment, conductive cylinder 410 is disposed to also penetrate through the bonding layer to make the connection with the baseplate.

Thus, in one embodiment, a wafer support structure in a chamber of a semiconductor manufacturing apparatus is provided. The wafer support structure includes a baseplate connected to a radio frequency (RF) power source, a dielectric block, a plurality of gas supply channels, a first electrode and a second electrode. The dielectric block is situated above the baseplate and is defined for supporting the wafer during the operation of the chamber. The first electrode is embedded in the top half of the dielectric block, where a top surface of the first electrode is substantially parallel to the top surface of the dielectric block, and the first electrode is connected to a DC power source. Further, the second electrode is embedded in the dielectric block below the first electrode, the second electrode being electrically connected to the baseplate that is connected to the RF power source, where a top surface of the second electrode is substantially parallel to a top surface of the dielectric block.

In one embodiment, the distance between the top surface of the dielectric block and the top surface of the first electrode is in the range from 0.2 mm to 0.5 mm, and the distance from the first electrode to the second electrode is in the range from 0.3 mm to 3 mm.

Figure 5:
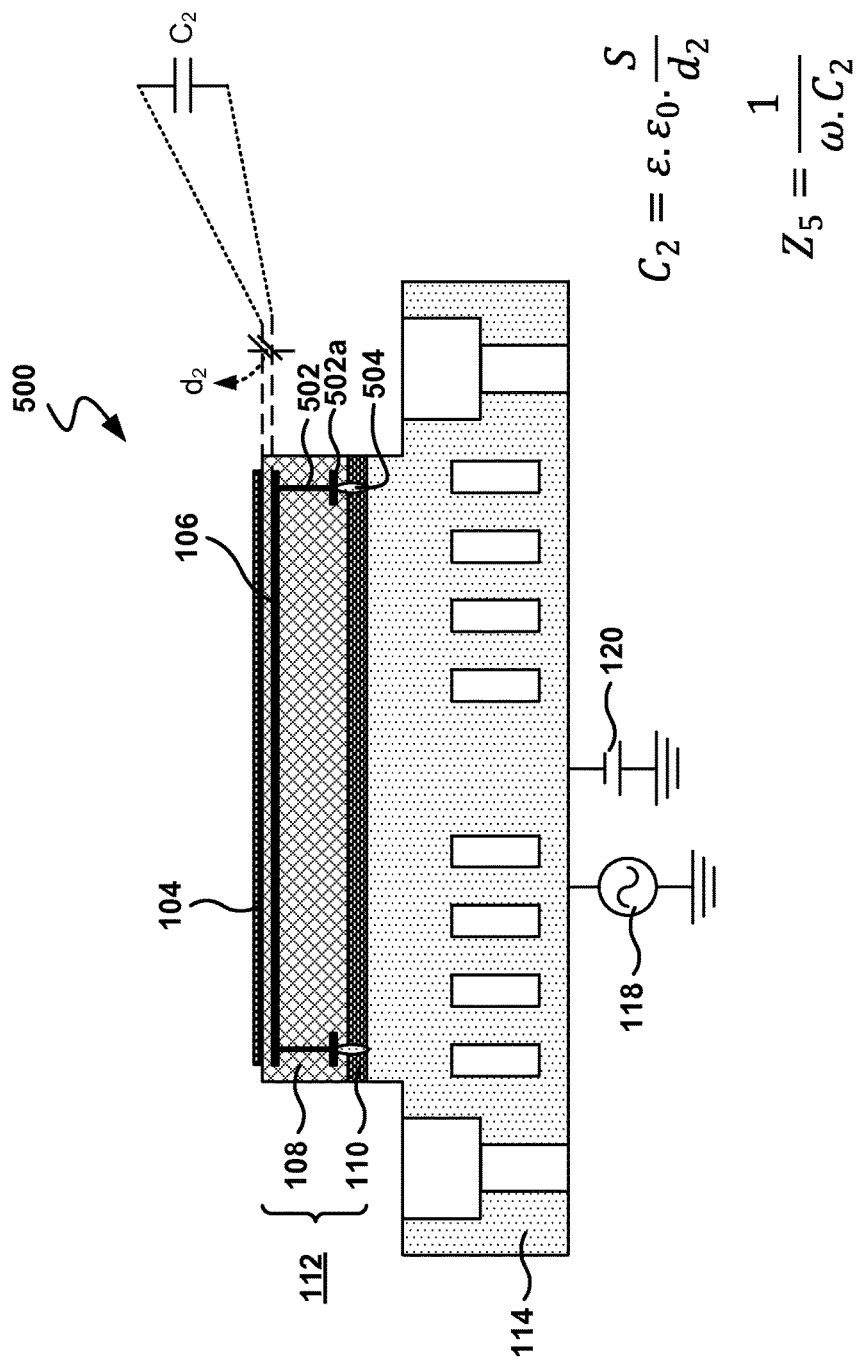
FIG. 5 illustrates an ESC 500 with electrode in the dielectric block connected to the baseplate, which is coupled to RF and DC power, according to one embodiment.

FIG. 5 illustrates an ESC 500 with electrode in the dielectric block connected to the baseplate, which is coupled to RF and DC power, according to one embodiment. ESC 500 includes baseplate 114 and DC electrode 106, similar to the ESC of FIG. 1A, but the ESC 500 also includes an electrical connection from baseplate 114 to the DC electrode 106. In one embodiment, DC electrode 106 (which is also an RF electrode in this embodiment) is electrically connected to the baseplate through via 502 and gasket 504, but other connections are possible, such as the connections described in FIGS. 4B-4D to connect the RF electrode to the baseplate. A contact surface 502a at the bottom of via connector 502 is provided for establishing contact between via connector 502 and RF gasket 504.

Since the baseplate is now connected to the DC electrode 106, it is not necessary to have a separate vertical connector to connect the DC power to the DC electrode, as shown in FIG. 1A. Instead, both RF power source 118 and DC power source 120 are connected to the baseplate, therefore DC electrode 106 is connected to both RF power and DC power, which means that DC electrode 106 also operates as an RF electrode.

In this embodiment, the RF current has to flow through capacitor $C_2$ formed between DC electrode 106 and the top surface of the ESC 500, similar to the capacitor described above with reference to FIG. 3. Therefore, capacitance $C_2$ is calculated as $$C_2 = \varepsilon \cdot \varepsilon_0 \cdot \frac{S}{d_2},$$

and the resulting impedance $Z_3$ is calculated according to the equation $$Z_3 = \frac{1}{\omega \cdot C_2}.$$

As in the case of FIG. 3, the RF power is closer to the top surface of the ESC 500, resulting in lower impedance and lower voltage, thereby decreasing the probability of having light-up of the coolant gas. This configuration simplifies the design and the manufacturing of the ESC 500, because both RF and DC travel through the same path.

In one embodiment, the distance $d_2$ between the top surface of the dielectric block and the top surface of the first electrode is in a range of 0.2 mm to 0.5 mm. Further yet, in one embodiment, the thickness of the dielectric block 112 is in the range from 3 mm to 20 mm. In one embodiment, the thickness of the dielectric block 112 is 5.5 mm. In one embodiment, bonding layer 110 has a height in the range of 0.1 mm to 1 mm, but other values are also possible.

The same principles presented above for embodiments of ESC's 100, 200, 300, and 400 may be applied to the embodiments for implementing ESC 500. The embodiment illustrated in FIG. 5 should therefore not be interpreted to be exclusive or limiting, but rather exemplary or illustrative.

Figure 6:
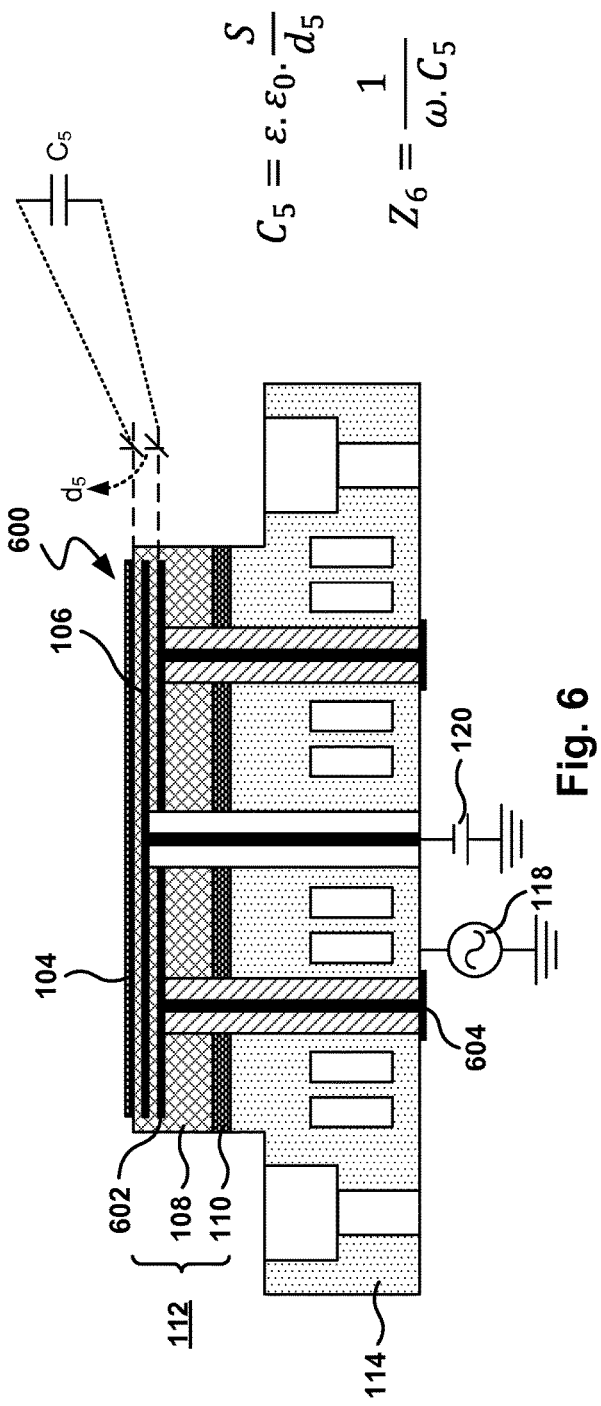
FIGS. 6-7 illustrate an ESC with RF electrodes shorted to the baseplate, according to one embodiment.
Figure 7:
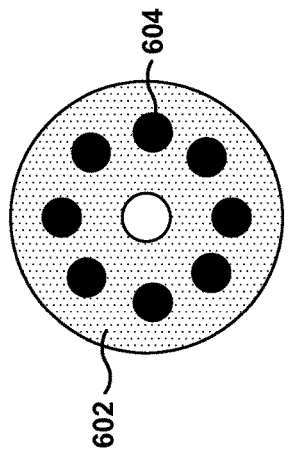

FIGS. 6-7 illustrate an ESC 600 with RF electrodes shorted to the baseplate, according to one embodiment. FIG. 6 is a side view of ESC 600. ESC 600 of FIG. 6 includes the same baseplate 114 and DC electrode 106 as in FIG. 1A, but the ESC also includes an RF electrode 602 in dielectric block 112. In one embodiment, RF electrode 602 is above bonding layer 110 and below DC electrode 106.

RF electrode 602 is electrically connected to baseplate 114 through one or more RF terminal connectors 604. In one embodiment, the one or more terminal connectors 604 are disposed away from the center or the RF electrode 602, but in other embodiments, the configuration could be reversed with one RF terminal disposed on the center and one or more DC terminals dispose away from the center to connect high voltage to the DC electrode 106.

The electrical behavior of the RF electrode 602 is similar to the RF electrode 402 of FIG. 4A, as both ESC 400 and 600 include an RF electrode below the DC electrode, although the connection of the RF power to the DC electrode is different.

Therefore, if the distance between RF electrode 602 and the top of the ceramic puck 108 is $d_5$, the capacitance $C_5$ for the RF current is calculated as $$C_5 = \varepsilon \cdot \varepsilon_0 \cdot \frac{S}{d_5},$$

and the resulting impedance $Z_6$ is calculated as $$Z_6 = \frac{1}{\omega \cdot C_5}.$$

In one embodiment, the distance between the top surface of the dielectric block and the top surface of the DC electrode is in a range of 0.2 mm to 0.5 mm, and the distance $d_5$ from the top surface of the dielectric block to RF electrode 602 is in a range from 1 mm to 3 mm, but other values are also possible. Further yet, in one embodiment, the thickness of the dielectric block 112 is in the range from 3 mm to 20 mm. In one embodiment, the thickness of the dielectric block 112 is 5 mm. In one embodiment, bonding layer 110 has a height in the range of 0.1 mm to 1 mm, but other values are also possible.

FIG. 7 is a top view of the ESC 500, which illustrates how the RF terminal connectors (e.g., 8 terminal connectors) are disposed in a circle around the center of the RF electrode 602. In other embodiments, the number of terminal connectors 602 may be different, such as 1, 2, 4, etc., or any value between 1 and 48.

The same principles presented above for embodiments of ESC's 100, 200, 300, 400, and 500 may be applied to the embodiments for implementing ESC 600. The embodiment illustrated in FIG. 6 should therefore not be interpreted to be exclusive or limiting, but rather exemplary or illustrative.

A simple comparison of the performance of the different ESC embodiments may be performed by calculating the different resulting impedances. For the calculations, it is assumed a dielectric puck with the thickness of 5 mm, a bond thickness of 0.25 mm, and a distance of 0.3 mm between the DC electrode and the top of the ESC. For ESC 200, the distance between the bottom electrode and the baseplate is 1.35 mm; and for ESCs 400 and 600, the distance between the top of the ESC and the RF electrode is 0.95 mm.

The resulting calculated impedances are: for ESC 102, 2305 pF; for ESC 200, 694 pF; for ESC 300, 124 pF; for ESC 400, 392 pF; for ESC 500, 124 pF; and for ESC 600, 392 pF. Without wishing to be bound by theory, it is believed that other factors may be weighed when selecting a solution, such as the cost of manufacturing the ESC. For example, with ESC 200, the basic design of the ESC stays the same, except for the change in the embedded floating electrode. ESC 300 may be more expensive because of the additional circuitry to share the RF and DC powers.

For ESC 400, the connection with the RF gasket has to be carefully manufactured. ESC 500 has a high voltage applied to the baseplate, which requires consideration when analyzing the functioning of the chamber. ESC 600 provides more control because of the separate RF connectors, but it is more complex to manufacture than other embodiments.

Further, an embodiment is presented of a method for eliminating cooling-gas light-up within an Electrostatic Chuck (ESC). While the various operations of this method are presented and described sequentially, one of ordinary skill will appreciate that some or all of the operations may be executed in a different order, be combined or omitted, or be executed in parallel.

In one embodiment, the method includes an operation for connecting a baseplate to a radio frequency (RF) power source, and an operation for placing a dielectric block above the baseplate. The dielectric block is configured for supporting the wafer during operation of a chamber for processing the wafer, and a plurality of gas supply channels are configured for cooling the bottom surface of the wafer.

In addition, the method includes an operation for embedding a first electrode in a top half of the dielectric block. The top surface of the first electrode is substantially parallel to a top surface of the dielectric block, and the first electrode is connected to a DC power source. Further yet, the method includes an operation for embedding a second electrode in a bottom half of the dielectric block. The second electrode is electrically connected to the first electrode, and a top surface of the second electrode is substantially parallel to a top surface of the dielectric block.

Figure 8:
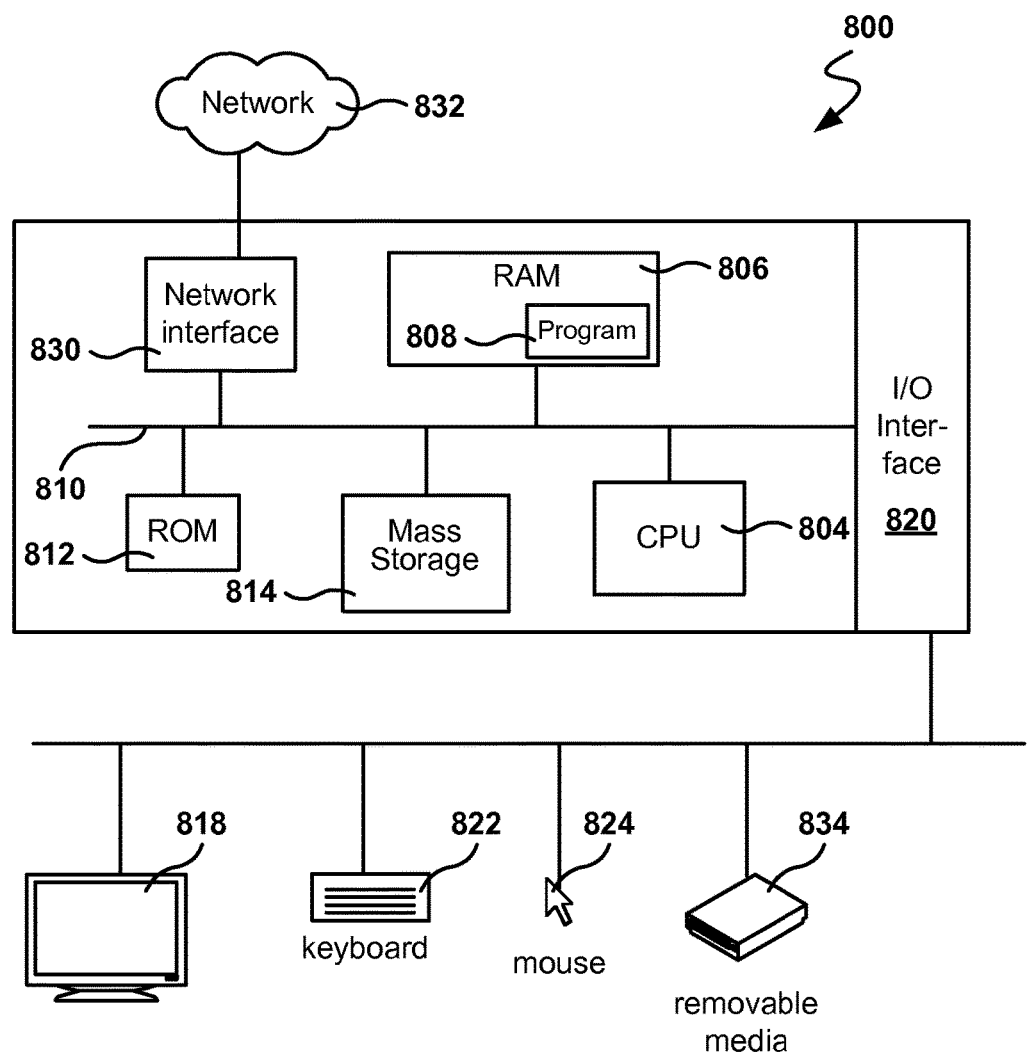
FIG. 8 is a simplified schematic diagram of a computer system for implementing embodiments.

FIG. 8 is a simplified schematic diagram of a computer system 800 for implementing embodiments. It should be appreciated that the methods described herein may be performed with a digital processing system, such as a conventional, general-purpose computer system. Special purpose computers, which are designed or programmed to perform only one function may be used in the alternative. The computer system includes a central processing unit (CPU) 804, which is coupled through bus 810 to random access memory (RAM) 806, read-only memory (ROM) 812, and mass storage device 814. System controller program 808 resides in random access memory (RAM) 806, but can also reside in mass storage 814.

Mass storage device 814 represents a persistent data storage device such as a floppy disc drive or a fixed disc drive, which may be local or remote. Network interface 830 provides connections via network 832, allowing communications with other devices. It should be appreciated that CPU 804 may be embodied in a general-purpose processor, a special purpose processor, or a specially programmed logic device. Input/Output (I/O) interface provides communication with different peripherals and is connected with CPU 804, RAM 806, ROM 812, and mass storage device 814, through bus 810. Sample peripherals include display 818, keyboard 822, cursor control 824, removable media device 834, etc.

Display 818 is configured to display the user interfaces described herein. Keyboard 822, cursor control 824, removable media device 834, and other peripherals are coupled to I/O interface 820 in order to communicate information in command selections to CPU 804. It should be appreciated that data to and from external devices may be communicated through I/O interface 820. The embodiments can also be practiced in distributed computing environments where tasks are performed by remote processing devices that are linked through a wire-based or wireless network.

Embodiments may be practiced with various computer system configurations including hand-held devices, microprocessor systems, microprocessor-based or programmable consumer electronics, minicomputers, mainframe computers and the like. The embodiments can also be practiced in distributed computing environments where tasks are performed by remote processing devices that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relate to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more embodiments can also be fabricated as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

What is claimed is:

1. A wafer support structure in a chamber of a semiconductor manufacturing apparatus, the wafer support structure comprising:
    a baseplate connected to a radio frequency (RF) power source;
    a dielectric block, situated above the baseplate, the dielectric block having a bottom surface interfaced with the baseplate and a top surface for supporting a wafer when present;
    a plurality of gas supply channels disposed in the baseplate and extending from the baseplate and through the dielectric block to a location proximate to the top surface of the dielectric block;
    a first electrode embedded in a top half of the dielectric block, the first electrode being proximate and directly below the top surface of the dielectric block, wherein a top surface of the first electrode is substantially parallel to the top surface of the dielectric block, wherein the first electrode is connected to a direct current (DC) power source; and
    a second electrode embedded in a bottom half of the dielectric block, the second electrode having a surface that is proximate and above a top surface of the baseplate, wherein a separation distance in the dielectric block is defined between the first electrode and the second electrode, the second electrode being electrically connected to the first electrode by vertical connectors that are arranged circularly near an outer diameter of the dielectric block, wherein a bottom surface of the second electrode is substantially parallel to a top surface of the baseplate.

2. The wafer support structure as recited in claim 1, wherein the dielectric block is defined by a ceramic puck and a bonding layer, the bonding layer bonding the ceramic puck to the baseplate.

3. The wafer support structure as recited in claim 1, wherein the second electrode is connected to the first electrode through said vertical connectors defined as one or more vertical vias embedded in the dielectric block, the one or more vertical vias disposed below the first electrode and proximate to a periphery of the first electrode.

4. The wafer support structure as recited in claim 1, wherein a first capacitance is formed between the top surface of the dielectric block and the top surface of the first electrode and a second capacitance is formed between the top surface of the second electrode and a top surface of the baseplate.

5. The wafer support structure as recited in claim 4, wherein an impedance to the RF power through the dielectric block is associated with the first capacitance and the second capacitance.

6. The wafer support structure as recited in claim 1, wherein a distance between the top surface of the dielectric block and the top surface of the first electrode is in a range of 0.2 mm to 0.5 mm, wherein a distance from the second electrode to the baseplate is in a range from 1 mm to 3 mm.

7. The wafer support structure as recited in claim 1, wherein a distance from the first electrode to the second electrode is greater than a distance from the top surface of the dielectric block to the first electrode, wherein the distance from the first electrode to the second electrode is greater than a distance from the second electrode to the baseplate.

8. The wafer support structure as recited in claim 1, wherein the baseplate is conductive, wherein the dielectric block is nonconductive.

9. The wafer support structure as recited in claim 1, wherein the baseplate is not connected to the DC power source.

10. A wafer support structure in a chamber of a semiconductor manufacturing apparatus, the wafer support structure comprising:
    a baseplate connected to a radio frequency (RF) power source;
    a dielectric block, situated above the baseplate, the dielectric block having a bottom surface interfaced with the baseplate and a top surface for supporting a wafer when present, the dielectric block is defined by a ceramic puck and a bonding layer which is below the ceramic puck and above the baseplate;
    a plurality of gas supply channels disposed in the baseplate and extending from the baseplate and through the dielectric block to a location proximate to the top surface of the dielectric block;
    a first electrode embedded in a top half of the ceramic puck, the first electrode being proximate and below the top surface of the ceramic puck, wherein a top surface of the first electrode is substantially parallel to the top surface of the ceramic puck and separated from the top surface of the ceramic puck by material of said ceramic puck, wherein the first electrode is connected through a vertical connector to a direct current (DC) power source below the baseplate; and
    a second electrode embedded in a bottom half of the ceramic puck, the second electrode having a surface that is proximate and above a top surface of the baseplate, wherein a separation distance in the ceramic puck is defined between the first electrode and the second electrode, the second electrode being electrically connected to the first electrode through a plurality of vertical conductive vias that are arranged circularly proximate to an outer diameter of the ceramic puck, wherein a bottom surface of the second electrode is substantially parallel to a top surface of the baseplate.

11. The wafer support structure as recited in claim 10, wherein a first capacitance is formed between the top surface of the ceramic puck and the top surface of the first electrode and a second capacitance is formed between the top surface of the second electrode and a top surface of the baseplate, wherein an impedance to the RF power through the ceramic puck is associated with the first capacitance and the second capacitance.

12. The wafer support structure as recited in claim 10, wherein a distance between the top surface of the ceramic puck and the top surface of the first electrode is in a range of 0.2 mm to 0.5 mm, wherein a distance from the second electrode to the baseplate is in a range from 1 mm to 3 mm.

13. A wafer support structure in a chamber of a semiconductor manufacturing apparatus, the wafer support structure comprising:
- a baseplate connected to a radio frequency (RF) power source;
- a dielectric block, situated above the baseplate, the dielectric block having a bottom surface interfaced with the baseplate and a top surface for supporting a wafer when present;
- a plurality of gas supply channels disposed in the baseplate and extending from the baseplate and through the dielectric block to a location proximate to the top surface of the dielectric block;
- a first electrode embedded in a top half of the dielectric block, the first electrode being proximate and below the top surface of the dielectric block, wherein a top surface of the first electrode is substantially parallel to the top surface of the dielectric block, wherein the first electrode is connected to a direct current (DC) power source; and
- a second electrode embedded in the dielectric block proximate and below the first electrode, a separation distance in the dielectric block is defined between the second electrode and the baseplate, the second electrode being electrically connected to the baseplate that is connected to the RF power source,
- wherein the second electrode is connected to the base plate through a plurality of vias embedded in the dielectric block and oriented proximate to a periphery of the second electrode;
- wherein a bottom surface of the second electrode is substantially parallel to a top surface of the baseplate.

14. The wafer support structure as recited in claim 13, wherein the second electrode is embedded on the top half of the dielectric block.

15. The wafer support structure as recited in claim 13, wherein a capacitance is formed between the top surface of the dielectric block and the top surface of the second electrode.

16. The wafer support structure as recited in claim 15, wherein an impedance to the RF power through the dielectric block is associated with the capacitance.

17. The wafer support structure as recited in claim 13, wherein a distance between the top surface of the dielectric block and the top surface of the first electrode is in a range of 0.2 mm to 0.5 mm, wherein a distance from the first electrode to the second electrode is in a range from 0.3 mm to 3 mm.

18. The wafer support structure as recited in claim 13, wherein the baseplate is not connected to the DC power source.

* * * * *